US012704870B2

(12) United States Patent
Heer et al.

(10) Patent No.: US 12,704,870 B2
(45) Date of Patent: Aug. 11, 2026

(54) SIGNAL GENERATOR CIRCUIT FOR A QUANTUM COMPUTER CONTROL DEVICE

(71) Applicant: Rohde & Schwarz GmbH & Co. KG, Munich (DE)

(72) Inventors: Flavio Heer, Zurich (CH); Andreas Messner, Zurich (CH)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 222 days.

(21) Appl. No.: 18/216,264

(22) Filed: Jun. 29, 2023

(65) Prior Publication Data

US 2024/0045465 A1 Feb. 8, 2024

(30) Foreign Application Priority Data

Aug. 5, 2022 (EP) .................................... 22188916

(51) Int. Cl.

| | |
|---|---|
| ***G06F 1/02*** | (2006.01) |
| ***G01R 13/02*** | (2006.01) |
| ***G01R 31/28*** | (2006.01) |
| ***G01R 31/317*** | (2006.01) |
| ***G01R 31/319*** | (2006.01) |

(Continued)

(52) U.S. Cl.
CPC ......... *G06F 1/022* (2013.01); *G01R 13/0254* (2013.01); *G01R 31/2841* (2013.01); *G01R 31/31726* (2013.01); *G01R 31/31919* (2013.01); *G06F 11/26* (2013.01); *G06N 10/20* (2022.01); *G06N 10/40* (2022.01)

(58) Field of Classification Search
CPC ........ G06F 1/022; G06F 11/26; G06F 11/267; G01R 13/02; G01R 13/04; G01R 31/284; G01R 31/31907; G01R 31/31917; G01R 31/2841; G01R 13/0254; G01R 31/31726; G01R 31/919; G06N 10/20; G06N 10/40; G06N 20/00
See application file for complete search history.

(56) References Cited

U.S. PATENT DOCUMENTS

| | | | | |
|---|---|---|---|---|
| 10,073,931 | B2 * | 9/2018 | Havard | G06F 11/3062 |
| 11,562,284 | B1 * | 1/2023 | Ryan | G06N 10/00 |
| 12,255,585 | B2 * | 3/2025 | Bardin | H03D 7/005 |
| 2005/0253617 | A1 * | 11/2005 | Roberts | G01R 31/31907 324/756.02 |

(Continued)

FOREIGN PATENT DOCUMENTS

CN 113113073 A 7/2021

OTHER PUBLICATIONS

"RF and Vector Signal Analysis for Oscilloscopes SignalVu® Datasheet". Sep. 22, 2016. Tektronix, Inc. (Year: 2016).*

(Continued)

*Primary Examiner* — Thomas J. Cleary
(74) *Attorney, Agent, or Firm* — DITTHAVONG, STEINER & MLOTKOWSKI

(57) ABSTRACT

The invention relates to a signal generator circuit (10), preferably for a quantum computer control device (30). The signal generator circuit (10) comprises a digital signal generating module (11) which is configured to generate a digital signal; a digital-to-analog converter, DAC (12), which is configured to convert the digital signal to an analog signal; and a digital oscilloscope unit (13) which is coupled between the digital signal generating module (11) and the DAC (12), wherein the digital oscilloscope unit (13) is configured to record at least a part of the digital signal.

11 Claims, 5 Drawing Sheets

(51) Int. Cl.

| | |
|---|---|
| ***G06F 11/26*** | (2006.01) |
| *G06N 10/20* | (2022.01) |
| *G06N 10/40* | (2022.01) |

(56) References Cited

U.S. PATENT DOCUMENTS

| | | | | |
|---|---|---|---|---|
| 2014/0062455 | A1 | 3/2014 | Nakayama | |
| 2016/0065221 | A1* | 3/2016 | Cheren | H03M 1/66 327/156 |
| 2017/0149539 | A1 | 5/2017 | Bawa | |
| 2023/0057479 | A1* | 2/2023 | Pickerd | G01R 31/2834 |
| 2023/0244459 | A1* | 8/2023 | Zou | G06F 8/41 717/140 |
| 2023/0259802 | A1* | 8/2023 | Klimov | G06N 10/20 706/62 |
| 2023/0401476 | A1* | 12/2023 | Finck | G06N 10/40 |
| 2024/0027507 | A1* | 1/2024 | Dalebroux | G01R 13/00 |

OTHER PUBLICATIONS

TechTarget Contributor. “What is oscilloscope?”. TechTarget. Online Dec. 15, 2021. Retrieved from Internet Aug. 5, 2025. <https://www.techtarget.com/whatis/definition/oscilloscope>. (Year: 2021).*

Alpert, Thomas, et al. “Arbitrary Waveform Generator Based on FPGA and High-Speed DAC with Real-Time Interface”. Prime 2012, 8th Conference on Ph.D. Research in Microelectronics & Electronics, Aachen, Germany. Session TG2—Transceivers I. IEEE. Jul. 6, 2012. (Year: 2012).*

Office Action for related European Patent Application No. 22188916.5-1001, dated Feb. 2, 2023, 6 pages.

Lin et al., “Scalable and customizable arbitrary waveform generator for superconducting quantum computing”, Research Article, AIP Advances, vol. 9, Issue 11, Nov. 18, 2019, 8 pages.

Yang et al., “FPGA-based electronic system for the control and readout of superconducting quantum processors”, Research Article, AIP Advances, vol. 93, Issue 7, Jul. 8, 2022, 17 pages.

* cited by examiner

SIGNAL GENERATOR CIRCUIT FOR A QUANTUM COMPUTER CONTROL DEVICE

RELATED APPLICATION

This application claims priority from European Patent Application No. 22 188 916.5, titled "Signal Generator Circuit for a Quantum Computer Control Device," filed Aug. 5, 2022, the contents of which are hereby incorporated herein in its entirety by this reference.

TECHNICAL FIELD OF THE INVENTION

The invention relates to a signal generator circuit, in particular for a quantum computer control device. The present disclosure further relates to a quantum computer control system and a method for inspecting a quantum computer control system.

BACKGROUND OF THE INVENTION

It is difficult to test large scale AWG (arbitrary waveform generator) based systems, due to the high resource and time requirements of such tests.

For instance, during such tests an analog output of the individual AWG channels is probed with commercially available oscilloscopes. In case of an AWG system with a large number of channels, this requires laborious re-cabling of the oscilloscopes used for testing. Depending on the size of the system, testing for a correct waveform output may require reconnecting thousands of cables two times (from actual signal sink to oscilloscope and back).

Large scale AWG based systems are, for example, used to control electronics of quantum computers. Current implementations of quantum computing systems employ a large number of AWG channels and potentially thousands of electrical lines. The signals provided by the individual AWGs should thereby be generated with precise amplitudes and should be timed precisely on a sub-nanosecond level. Both problems are aggravated by the large number of channels that work in parallel.

Thus, it is an objective to provide an improved signal generator circuit, in particular for a quantum computer control device, an improved quantum computer control system and an improved method for inspecting a quantum computer control system which avoid the above-mentioned disadvantages.

SUMMARY OF THE INVENTION

The object of the present invention is achieved by the solution provided in the enclosed independent claims. Advantageous implementations of the present invention are further defined in the dependent claims.

According to a first aspect, the invention relates to a signal generator circuit, comprising a digital signal generating module which is configured to generate a digital signal; a digital-to-analog converter, DAC, which is configured to convert the digital signal to an analog signal; and a digital oscilloscope unit which is coupled between the digital signal generating module and the DAC, wherein the digital oscilloscope unit is configured to record at least a part of the digital signal.

This achieves the advantage that the digital signal can be efficiently recorded by the signal generator unit prior to converting it to an analog signal. Thus, signals generated by the signal generator circuit can be directly recorded during a real use of the circuit and no oscilloscope needs to be manually connected to the circuit to record the output signal. The recorded digital signal can be analyzed and tested on a bit level with no noise added to the signal from the analog domain.

The signal generator circuit is suitable for a quantum computer control device. The analog signal can be a control signal for controlling a quantum computer, in particular for controlling one or more qubits of a quantum computer.

In an example, the analog signal can be an analog output signal of the signal generator circuit. Before outputting this analog output signal, this signal could be further processed by the signal generator circuit, e.g. a frequency conversion could be carried out.

The digital signal can define a waveform. The generated waveform can have a certain amplitude and timing. In particular, the timing of the signal may refer or relate to an exact time at which the waveform is generated, i.e., transmitted, by the signal generator circuit.

The digital oscilloscope unit can be configured to receive and process, e.g. analyze, the digital signal generated by the signal generator circuit. For instance, the digital oscilloscope unit is configured to detect the amplitude and/or timing of the signal. This information can then be compared to calculated or stored reference values in order to monitor and/or test the signal generator circuit. The digital oscilloscope unit can be implemented by hardware and/or software.

The digital signal generating module can be implemented in a field programmable gate array (FPGA) and/or ASIC of the signal generator circuit. In addition or alternatively, the digital oscilloscope unit can also be implemented in a field programmable gate array (FPGA) and/or ASIC.

In an embodiment, the digital signal generating module comprises an arbitrary waveform generator unit, AWG unit, for generating the digital signal.

In particular, the AWG unit is a digital AWG unit which is configured to generate digital waveforms with an arbitrary defined shape. The waveforms can be generated as repetitive signals or as single-shot signals (pulses).

The AWG unit can be configured to execute a (software) program to generate the above digital signals. The program can be a control program for controlling the AWG unit. The program can be implemented in a sequencer of an FPGA.

In an embodiment, the signal generator circuit comprises an output port which is configured to output the analog signal to an external device, in particular to a quantum computer.

Thus, the analog signal can be an analog output signal. The analog signal could be further processed by the signal generator circuit prior to outputting it via the output port.

This provides the advantage that the signal generator circuit can be used to generate analog control signals for external devices, in particular quantum computers. The control signal can be used for controlling one or more qubits of the quantum computer.

In an embodiment, the digital oscilloscope unit is configured to add an absolute or trigger-based time signature to the recorded digital signal.

This achieves the advantage that an amplitude and timing of a generated signal can be directly monitored and subsequently analyzed without requiring to connect external test devices, such as oscilloscopes, to an output port of the signal generator circuit.

In an embodiment, the signal generator circuit comprises a communication interface which is configured for forwarding the recorded digital signal and/or parameters of the recorded digital signal. The parameters of the recorded digital signal can comprise the signal amplitude and/or the signal timing.

The oscilloscope unit can be configured to forward the recorded digital signal, in particular with the added time signature, to a central control unit of a quantum computer control system via the communication interface. Alternatively or additionally, the oscilloscope unit can be configured to extract certain signal parameters from the digital signal, e.g. the timing and/or the amplitude of the signal, and to forward said signal parameters to the control unit via the communication interface. The recorded digital signal and/or the signal parameters can then be further analyzed by the central control unit.

In an embodiment, the signal generator circuit comprises a digital signal processor, DSP, which is coupled between the digital signal generating module and the DAC, wherein the DSP is configured to adapt the digital signal.

The DSP can be configured to adapt at least one of the following parameters of the digital signal: amplitude, scaling, phase delay, time delay, pre-distortion. The DSP can also be comprised by the digital signal generating module.

In particular, the digital oscilloscope is coupled between the DSP and the DAC. Further elements can be arranged between the DSP (or the AWG) and the DAC. For example, after the AWG unit which is playing the baseband signal, there can be digital mixing, interpolation (change of sampling rate) and/or filtering units arranged before the DAC. In this way, a base-band signal or an up-converted signal could be probed depending on the measurement requirements.

In an embodiment, the signal generator circuit comprises a signal generator interface which is configured to receive communication data; wherein the digital signal generating module is configured to generate the digital signal at least partially based on the received communication data.

The signal generator interface can be configured to forward the communication data to the digital signal generating module which generates the digital signal at least partially based on the communication data. The communication data can comprise control commands and/or measurement data.

According to a second aspect, the invention relates to a quantum computer control device for controlling a quantum computer, comprising a plurality of signal generator circuits according to the first aspect of the invention.

The quantum computer control device can further comprise a housing which houses the plurality of signal generator circuits. The ports and interfaces, e.g. output port, signal generator interface and/or communication interface, can be arranged on the housing.

In an example, the communication interfaces of the plurality of signal generator circuits can be formed by one physical communication interface of the quantum computer control device. Likewise, the signal generator interfaces of the plurality of signal generator circuits can be formed by one physical signal generator interface.

Each signal generator circuit can form a respective channel of the quantum computer control device.

In an embodiment, the analog signals provided by each of the plurality of signal generator circuits are control signals for controlling one or more qubits of the quantum computer. For instance, one to ten signal generator circuits can be assigned to one qubit of the quantum computer.

According to a third aspect, the invention relates to a quantum computer control system for controlling a quantum computer comprising a plurality of quantum computer control devices according to the second aspect of the disclosure.

For instance, the quantum computer control system may comprise up to 4,000 signal generator circuits (e.g., 1,000 qubits with 4 AWGs per qubit).

In an example, the quantum computer control system may further comprise a quantum computer which is connected to the quantum computer control devices.

In an embodiment, the quantum computer control system further comprises a central control unit which is connected to the quantum computer control devices; wherein the central control unit is configured to receive a recorded digital signal and/or properties of a recorded digital signal from one or more signal generator circuits of at least one of the plurality of quantum computer control devices; wherein the central control unit is further configured to analyze the received recorded digital signals and/or the properties of the recorded digital signals.

This achieves the advantage that a complex quantum computer control system with a large number of channels can be efficiently monitored and tested by means of a central control unit. The central control unit can thereby test and/or monitor if the various signal generator circuits of the system run correctly, i.e. if they generate electrical signals at exactly the right amplitude and with the correct timing. In this way, the central control unit can detect possible errors or bugs in the system.

In an embodiment, the quantum computer control devices are connected to each other in order to enable a synchronization, in particular a clock synchronization, of the devices.

For instance, the control devices can be connected to each other via the central control unit. For connecting the quantum computer control devices, as suitable communication technology can be used.

According to a fourth aspect, the invention relates to a method for inspecting, in particular debugging, a quantum computer control system, wherein the method comprises the steps of: generating at least one digital signal with a digital signal generating module of the quantum computer control system; converting the digital signal to an analog signal, wherein the analog signal is a control signal for controlling one or more qubits of a quantum computer; recording at least a part of the digital signal prior to said conversion; and analyzing the recorded digital signal.

The method can be carried out with the quantum computer control system according to the third aspect of the invention. In particular, the method can be carried out by the central controller and/or by the digital oscilloscope units of the quantum computer control system.

The control signal can be a signal for controlling one or more qubits of the quantum computer.

The step of analyzing the recorded digital signal may comprise extracting one or more signal parameters from the recorded digital signal, e.g. amplitude and/or timing, and analyzing said parameters, e.g. comparing them with stored or calculated reference values.

The method may comprise the further step of: adapting at least one parameter of the quantum computer control system based on said analysis. Thus, the method can also be used to control a quantum computer control system by adapting parameters of the system, e.g. if an error is detected.

However, it the step of analyzing the digital signal reveals that the system works properly (e.g., no error detected), no such adaption needs to be carried out.

For example, the method can be used to detect errors (bugs) in the quantum computer control system. Such errors can be faulty signals, e.g. signals with an inaccurate amplitude and/or timing. With the step of adapting at least one parameter of the quantum computer control system, a detected error can be removed or mitigated. The parameter may be a physical parameter, such as a signal parameter (e.g., amplitude and/or timing) of at least one further signal generated by the signal generator circuit of the quantum computer control system.

In an embodiment, the step of analyzing the recorded digital signal comprises comparing the recorded digital signal to at least one reference signal.

In an embodiment, the at least one reference signal is generated by an artificial intelligence unit and/or by a machine learning unit.

The artificial intelligence unit and/or the machine learning unit could preselect possible system errors and/or recognize typical error patterns based on previously detected errors In an embodiment, the artificial intelligence unit and/or the machine learning unit can be configured to control the digital signal generating module to generate the at least one digital signal.

In an embodiment, the reference signal comprises a digital waveform, wherein the recorded digital signal and the digital waveform are compare in real-time.

In an embodiment, the method can be carried out in a first mode (e.g., an online mode) in which the digital signal generating module is connected to a quantum computer and is used to control qubits of the quantum computer; and the method can be carried out in a second mode (e.g., an offline mode) in which the digital signal generating module is not connected to a quantum computer.

BRIEF DESCRIPTION OF THE DRAWINGS

The invention will be explained in the following together with the figures.

REFERENCE NUMERALS USED IN THE DRAWINGS

10—Signal generator circuit
11—Digital signal generating module
12—Digital-to-analog converter (DAC)
13—Digital oscilloscope unit
14—Digital signal processor (DSP)
15—Output port
16—Central control unit
17—Communication interface
21—Signal generator interface
22—Arbitrary waveform generator (AWG) unit
23—Signal processing unit

DETAILED DESCRIPTION OF THE PREFERRED EMBODIMENTS

Figure 1:
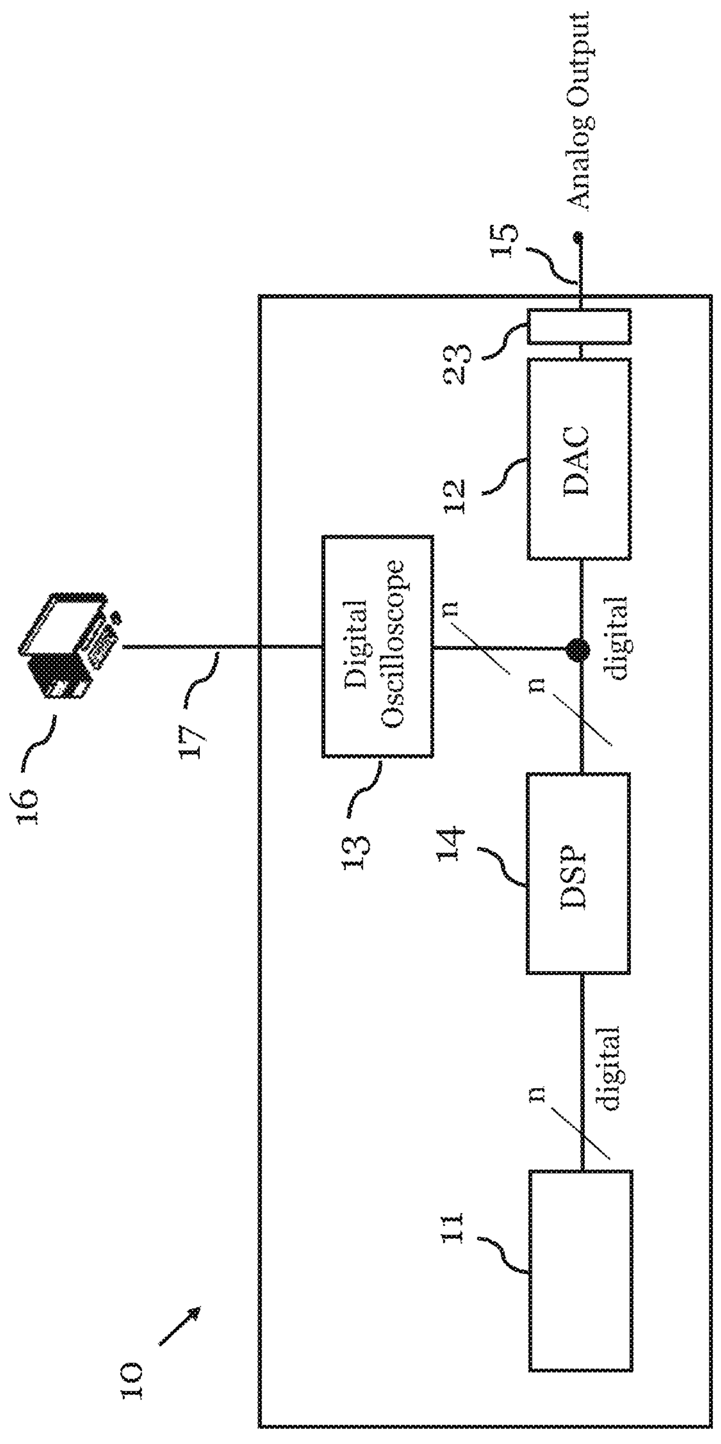
FIG. 1 shows a schematic diagram of a signal generator circuit according to an embodiment.

FIG. 1 shows a schematic diagram of a signal generator circuit 10 according to an embodiment The signal generator circuit 10 comprises a digital signal generating module 11 which is configured to generate a digital signal, a DAC 12 which is configured to convert the digital signal to an analog signal, and a digital oscilloscope unit 13 which is coupled between the digital signal generating module 11 and the DAC 12. The digital oscilloscope unit 13 is configured to record at least a part of the digital signal.

The signal generator circuit 10 can comprise an output port 15. The output port 15 can be configured to output the analog signal to an external device, in particular to a quantum computer. The analog signal can be a control signal for controlling the external device, e.g. a control signal for controlling one or more qubits of the quantum computer.

The signal generator circuit 10 in FIG. 1 comprises an optional signal processing unit 23 for processing the analog signal prior to outputting it via the output port 15. This processing can comprise an analog signal processing, e.g., a frequency conversion.

The analog signal can be an RF signal or a DC signal. For instance, the analog signal is a signal between DC and 9 GHz, in particular between 4.5 GHz and 18 or 20 GHz with, e.g., 2 GHz bandwidth.

The digital oscilloscope unit 13 can be arranged in the digital domain right before the DAC 12 which converts the digital signal to the analog signal. The digital oscilloscope unit 13 can record the stream of digital data sent to the DAC (i.e., the digital signal or a part thereof) and can add an absolute or trigger-based time signature to said data.

The digital oscilloscope unit 13 can be configured to transfer the collected data to a central control unit 16, where both waveforms and timing of the signal can be analyzed, allowing for a comprehensive test of the signal generator circuit 10 and/or of a device respectively system that comprises the signal generator circuit 10.

In particular, the signal generator circuit 10 comprises a communication interface 17 which is configured for forwarding the recorded digital signal and/or parameters of the recorded digital signal to the central control unit 16.

For example, the oscilloscope unit 13 is configured to control the communication interface 17 to forward the recorded digital signal, preferably with the added time signature, and/or to forward certain parameters of the recorded signal (e.g., amplitude and timing of the digital signal) to the central control unit 16. The recorded digital signal (or its parameters) can then be further analyzed by the central control unit 16.

The signal generator circuit 10 can further comprise a DSP 14 which is coupled between the digital signal generating module 11 and the DAC 12. The DSP 14 can be configured to adapt the digital signal. For instance, The DSP 14 can comprise at least one mixer for mixing the waveform provided by the digital signal generating module 11 with a carrier signal.

In another example, the digital signal generating module 11 comprises the DSP 14. I.e., the DSP 14 can be integrated in the digital signal generating module 11. The digital signal generating module 11 can also comprise an additional DSP.

The DAC 12 can be configured to convert the digital signal, e.g. a digital series of numbers, into the analog signal.

Figure 2:
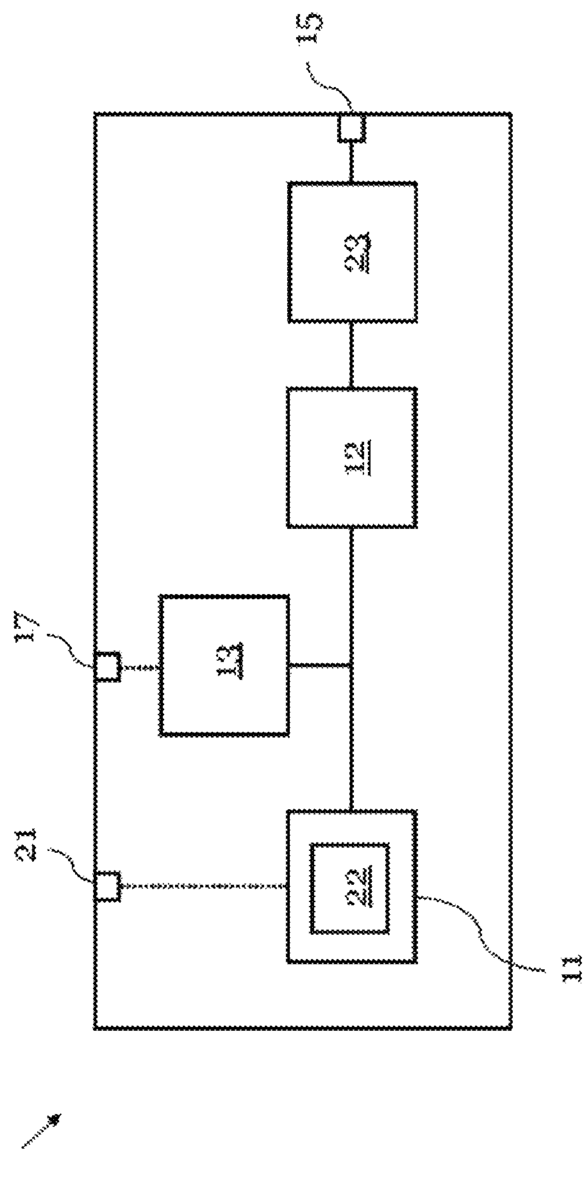
FIG. 2 shows a schematic diagram of a signal generator circuit according to an embodiment.

FIG. 2 shows a schematic diagram of the signal generator circuit 10 according to an embodiment. The circuit 10 shown in FIG. 2 can be essentially identical to the signal generator circuit 10 shown in FIG. 1.

The digital signal generating module 11 of the circuit 10 may comprise an AWG unit 22 for generating the digital signal. The AWG unit 22 can be implemented in an ASIC or an FPGA. Alternative to the AWG unit 22, the digital signal generating module 11 can also comprise a different type of signal generator.

The signal generator circuit 10 may further comprise a signal generator interface 21 which is configured to receive communication data, preferably in a digital form. The digital signal can be generated by the AWG unit 22 at least partially based on the received communication data. The communication data can comprise control commands and/or measurement results. The signal generator interface 21 can be connected to the central control instrument or a different device (e.g., a qubit readout instrument) for receiving the communication data.

The AWG unit 22 can comprise a digital waveform memory and a sequencer that controls the AWG unit 22. In particular, the sequencer controls which waveforms are generated and in which order. The generated waveforms can comprise: pulses, pulse shapes, pulse sequences, addition of pulses and/or pulses in dependence of external events. The external events can be measurement results, in particular the state of a qubit (e.g., [1;0]), or counting events, which can be fed to the AWG unit 22 via the signal generator interface 21. The qubit states can be provided by qubit readout instruments and/or by the central control unit 16.

The sequencer can execute a program to control the waveform generation. The program can be implemented in the sequencer of an FPGA or ASIC of the circuit 10. This is preferable due to the real-time-requirements of the signal generation. However, it is also possible that the program is executed in an external processor.

Thus, the signal generator circuit 10 can be an AWG circuit which generates analog electric signals from its waveform memory. The stream of digital data from the memory might undergo digital signal processing in the DSP 14 before it is sent to the DAC 12 which converts the digital values to analog signals. In this way, the signal generator circuit 10 can be used for a flexible and precise generation of analog signals for controlling the electronics of a quantum computer.

The digital oscilloscope unit 13 can be implemented as hardware and/or software. In particular, the oscilloscope unit 13 may also be implemented in an FPGA or ASIC. The digital oscilloscope unit 13 can be coupled to a digital output of the signal generating module 11 and/or of the DSP 14. Thus, no analog-to-digital converter is required in front of the oscilloscope unit 13. The digital oscilloscope unit 13 may comprise a trigger unit and/or an acquisition memory.

For instance, the digital oscilloscope unit 13 allows to monitor the digital signal that is generated by the signal generating module 11, in particular the AWG unit 22, e.g. in response to the communication data or any other event. The digital oscilloscope unit 13 and/or the central control unit 16 can thereby compare a signal that is generated by the AWG unit 22 to a reference signal.

Since the digital oscilloscope unit 13 is integrated in the digital domain of the circuit 10, this testing is less laborious (no reconnection of cables) and less error prone (no noise from analog signals) as compared to using a conventional oscilloscope that is connected to the output port 15. Furthermore, the digital oscilloscope unit 13 enables an automatic testing of the circuit 10.

The digital signal generating module 11, the DAC 12, the digital oscilloscope unit 13 and/or the signal processing unit 23 can be implemented in an RF SoC (radio frequency system-on-a-chip), e.g. an RF board with several chips, SoCs, FPGAs and/or ASICs. The RF SoC may comprise one or more FPGAs. In particular, the RF SoC can comprise an integrated logic analyzer for monitoring the digital signal generating by the signal generating module 11. The RF SoC can have one or more trigger ports that can be combined to a single trigger condition.

Figure 3:
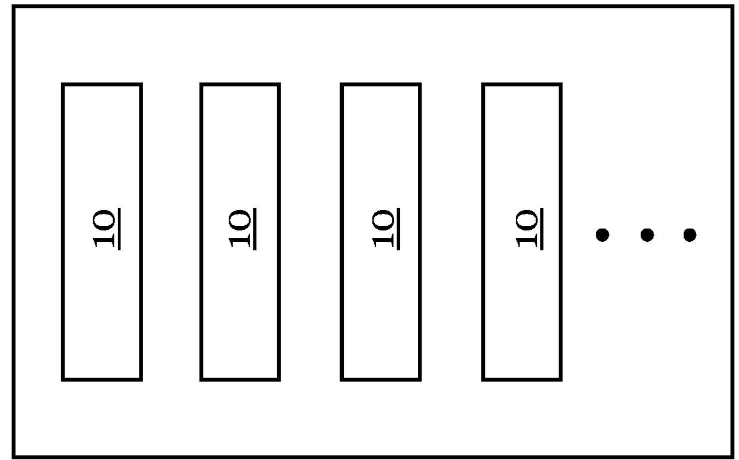
FIG. 3 shows a schematic diagram of a quantum computer control device according to an embodiment.
Figure 3:
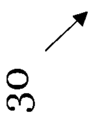

FIG. 3 shows a schematic diagram of a quantum computer control device 30 according to an embodiment. The quantum computer control device 30 comprises a plurality of signal generator circuits 10, e.g. as shown in FIG. 1 or 2.

The quantum computer control device 30 can be connected to a quantum computer, in particular via the output ports 15 of its signal generator circuits 10. The analog signals provided by each of the signal generator circuits 10 can be control signals for controlling one or more qubits of the quantum computer.

The quantum computer control device 30 can comprise a housing which houses the plurality of signal generator circuits. The ports and interfaces (output port, signal generator interface, and communication interface) can be arranged on the housing. In particular, the communication interfaces and the signal generator interfaces of the plurality of signal generator circuits can each be formed by one respective physical interface on the quantum computer control device.

The quantum computer control device 30 can be a quantum control instrument. The digital signal generating modules 11 and/or the digital oscilloscope units 13 can be a part of the already existing digital electronics (FPGA or ASIC) of the device 30 or can be stand-alone subsystems.

For instance, the quantum computer control device 30 can have 4 or 8 output channels to control one or multiple qubits. Alternative implementations might have 16 or 32 output ports.

Figure 4:
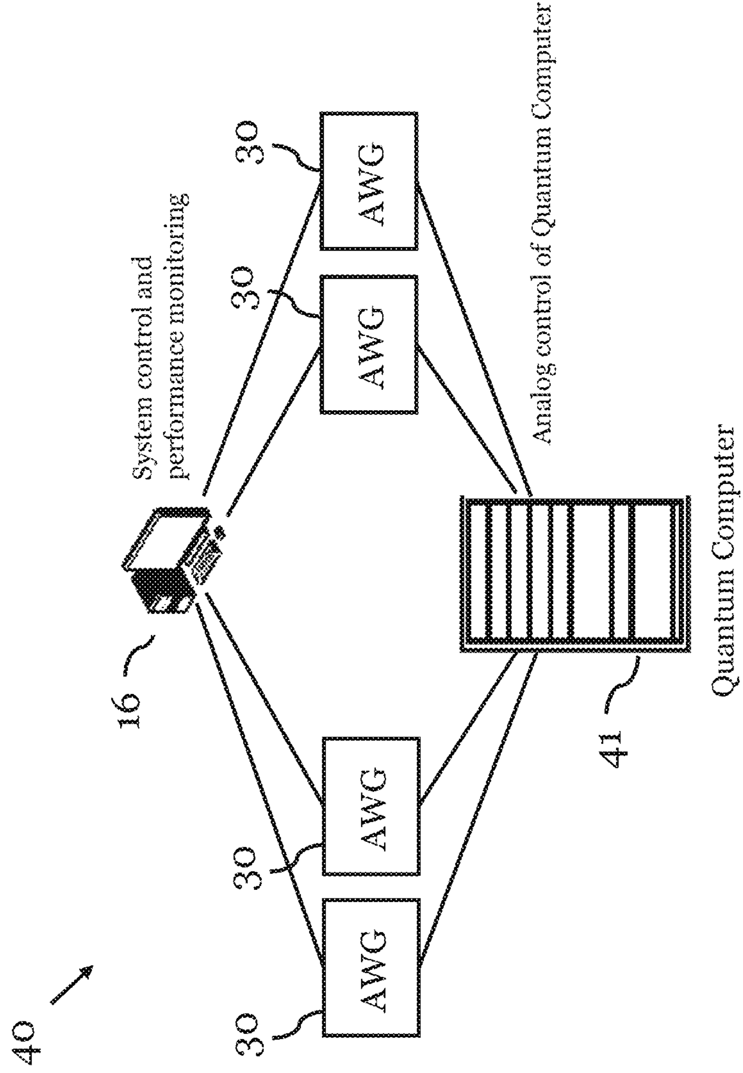
FIG. 4 shows a schematic diagram of a quantum computer control system according to an embodiment.

FIG. 4 shows a schematic diagram of a quantum computer control system 40 according to an embodiment. The quantum computer control system 40 comprises a plurality of quantum computer control devices 30 as shown in FIG. 3.

The quantum computer control system 40 can comprise up to 4,000 quantum computer control devices 30, each quantum computer control device 30 comprising a plurality of instances of the signal generator circuit 10. In particular, each signal generator circuit 10 forms a channel of the system 40 that can be connected to the quantum computer 41.

The system 40 may further comprise the central control unit 16 which is connected to the quantum computer control devices 30. The central control unit 16 can be an external computer.

The central control unit 16 can be configured to receive recorded digital signals and/or parameters of recorded digital signals from the digital oscilloscope units 13 of one or more signal generator circuits of the devices 30 in the system 40.

The central control unit 16 can further be configured to analyze the received recorded digital signals and/or the parameters of the recorded digital signals. The parameters can be amplitude and/or timing of the digital signals. In this way, the amplitude and timing behavior of large-scale AWG based systems can be precisely tested. In particular, it can be thoroughly tested if electrical signals, that are generated by the system 40, have a correct waveform and/or if the waveform is played at a correct time. In particular, the absolute timing information allows to relate any signal from any output port 15 to another signal from a different channel.

With such tests, a system quality of the controls system 40 can be ensured and maintenance costs of the system 40 can be reduced, particularly when the system 40 has a large number of channels (i.e., signal generator circuits 10).

Ensuring that a system with such many AWG channels runs correctly would be much more difficult and laborious with conventional techniques, e.g. connecting an oscilloscope to the analog output of each channel. In particular, testing a timing precision between different signals would be cumbersome with conventional oscilloscopes, because conventional oscilloscopes often have no more than four channels, whereas real world systems can exhibit thousands of channels. In particular, the implementation of the digital oscilloscope units 13 in the individual channels allows users and operators of such AWG-based systems 40 to perform (automated) self-tests of the system 40 which is an important aspect when the systems become so large that comprehensive manual testing are no longer feasible.

The central control unit 16 can further be configured to control the quantum computer control devices 30 of the system. For instance, the central control unit 16 can control the signal generating module, e.g. via the communication interface 21, and the DSPs 14 of one, more or all signal generator circuits 10 in the system 40.

The quantum computer control devices 30 can be connected to each other via synchronization connections. This allows to synchronize the signal generation by the different devices 30, e.g. to make sure that they all work on the same clock. The synchronization connections can be established via the central control unit 16. In particular, the central control unit 16 can be configured to set all devices 30 to the same clock.

For example, the central control unit 16 comprises a plurality of input channels connected to qubit readout instruments and a plurality of output channels connected to qubit control instruments, e.g. to the quantum computer control devices 30. The central control unit 16 can further comprise a synchronization device which is configured to operate the qubit control instruments (quantum computer control devices 30) over a series of control and readout cycles at least partially based on input from the qubit readout instruments.

The system 40 may further comprise the quantum computer 41. The quantum computer 41 can be a spin-based quantum computer. In this quantum computer, single spins can be confined in semiconductor quantum dots, wherein the relative coupling can be controlled via metallic gates. The analog signals of the signal generator circuits 10 can be used for gate operations in the quantum computer. For example, the signal generator circuits 10 generate fast pulses which are applied to the metallic gates. These pulses can be used to control quantum dot energy levels and couplings and to drive two-qubit gates. Additional pules can be applied to multiple gates to counteract the effect of cross-coupling.

Figure 5:
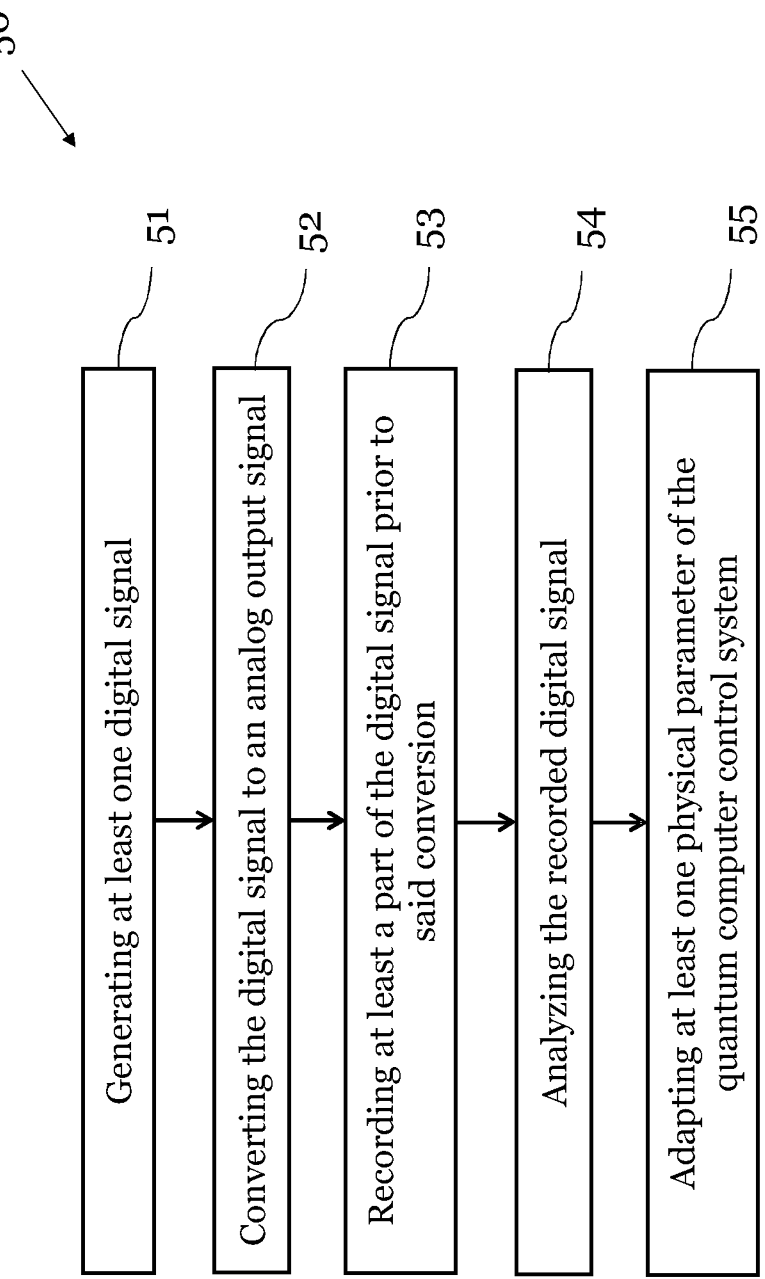
FIG. 5 shows a flow diagram of a method for inspecting a quantum computer control system according to an embodiment.

FIG. 5 shows a flow diagram of a method 50 for inspecting, in particular debugging, a quantum computer control system 40 according to an embodiment.

The method 50 comprises the steps of: generating 51 at least one digital signal with a digital signal generating module 11 of the quantum computer control system 40, and converting 52 said digital signal to an analog signal, wherein the analog signal is a control signal for controlling a quantum computer 41, preferably for controlling one or more qubits of the quantum computer 41. The method 50 further comprises the steps of recording 53 at least a part of the digital signal prior to said conversion, analyzing 54 the recorded digital signal.

The method 50 shown in FIG. 5 comprises the additional step of: adapting 55 at least one parameter of the quantum computer control system 40 based on said analysis.

The step of analyzing 54 the recorded digital signal may comprise extracting parameters of the recorded digital signal, such as amplitude and/or timing of the signal, and analyzing said parameters. In particular, if the analysis step reveals that everything works properly (e.g., no errors), no parameters of the system 40 are adapted For example, method 50 can be used to detect errors (bugs) in the quantum computer control system. Such errors can be faulty signals, e.g. signals with an inaccurate amplitude and/or timing. With the step of adapting 55 at least one parameter of the quantum computer control system 40, a detected error can be removed or mitigated. The parameter can be a physical parameter, e.g., a signal parameter of at least one further signal generated by one of the signal generator circuits 10 of the quantum computer control system 40.

The step of analyzing 54 the recorded digital signal may comprise comparing the recorded digital signal to at least one reference signal.

The reference signal, which is used to compare the recorded digital signal can be downloaded to the device carrying out the method 50 (e.g., one or more digital oscilloscope units 13) in form of a digital waveform. Then the recorded signal and the reference signal can be compared in real time, e.g., without having to send the signal(s) to a central unit first.

For example, this reference signal is generated by an artificial intelligence unit and/or by a machine learning unit. The artificial intelligence unit and/or the machine learning unit could preselect possible system errors and/or recognize typical error patterns based on previously detected bugs.

The digital (test) signals to be generated can be created by said artificial intelligence unit and/or machine learning unit. For instance, the artificial intelligence unit and/or machine learning unit control the digital signal generating module 11 to generate said signals.

For instance, the method can be used in two different modes: an online mode and an offline mode. The system 40 can be texted online when a quantum computer is connected and quibits are controlled by the system 40. However, the system 40 can also be tested offline to only test the correct functioning of the room temperature electronics without the quantum computer being connected to the system 40. This is especially useful for automated test systems. In particular, the online/offline (i.e., first/second) modes can be modes of the quantum computer control system 40.

The method 50 can be carried out with a quantum computer control system 40 as shown in FIG. 4. In particular, the steps 53-55 can be carried out by one or more digital oscilloscope units 13 of the control devices 30 and/or by the central control unit 16 of the system 40 (and/or by a further computer device). The steps 51 and 52 can be carried out by the signal generating module 11 respectively by the DAC 12 of a signal generator circuit 10 in the system 40. The method 50 can be at least partially computer implemented.

All features described above or features shown in the figures can be combined with each other in any advantageous manner within the scope of the invention.

The invention claimed is:

1. A quantum computer control system for controlling a quantum computer, comprising plurality of a quantum computer control devices, wherein each quantum computer control device comprises a signal generator circuit, and wherein the signal generator circuit comprises:

a digital signal generating module which is configured to generate a digital signal, wherein the digital signal generating module comprises an arbitrary waveform generator unit, AWG unit, implemented in an FPGA or ASIC;

a digital-to-analog converter, DAC, which is configured to convert the digital signal to an analog signal; and a digital oscilloscope unit which is coupled between the digital signal generating module and the DAC, wherein the digital oscilloscope unit is configured to record at least a part of the digital signal before the DAC converts the digital signal to the analog signal, wherein the digital oscilloscope unit is further configured to add an absolute or trigger-based time signature to the recorded digital signal, wherein the quantum computer control system further comprises a central control unit comprising a synchronization device circuit and a plurality of input channels connected to qubit readout instruments and a plurality of output channels connected to the quantum computer control devices;

wherein the central control unit is configured to receive a recorded digital signal and/or parameters of a recorded digital signal from one or more signal generator circuits of the quantum computer control devices; and wherein the central control unit is further configured to analyze the received recorded digital signals and/or the parameters of the recorded digital signals.

2. The quantum computer control system of claim 1, wherein the quantum computer control device is connected to at least one other quantum computer control device of the quantum control system in order to enable a synchronization, in particular a clock synchronization, of the devices.

3. A method for inspecting, in particular debugging, a quantum computer control system of claim 1, the method comprising the steps of generating at least one digital signal with a digital signal generating module of the quantum computer control system, wherein the digital signal generating module comprises an arbitrary waveform generator unit, AWG unit, implemented in an FPGA or ASIC;

converting the digital signal to an analog signal, wherein the analog signal is a control signal for controlling a quantum computer;

recording at least a part of the digital signal prior to said conversion; and adding an absolute or trigger-based time signature to the recorded digital signal; and analyzing the recorded digital signal, transmitting the recorded digital signal and/or parameters of the recorded digital signal to the central control unit, receiving, at the central control unit, inputs from qubit readout instruments via input channels, and analyzing, by the central control unit, the recorded digital signal and/or the parameters of the recorded digital signals.

4. The method of claim 3 comprising the further step of:

adapting at least one parameter of the quantum computer control system based on said analysis.

5. The method of claim 3, wherein the step of analyzing the recorded digital signal comprises comparing the recorded digital signal to at least one reference signal.

6. The method of claim 5, wherein the at least one reference signal comprises a digital waveform, wherein the recorded digital signal and the digital waveform are compare in real-time.

7. The method of claim 3, wherein the method is operable in a first mode in which the digital signal generating module is connected to a quantum computer and is used to control qubits of the quantum computer; and wherein the method is operable in a second mode in which the digital signal generating module is not connected to a quantum computer.

8. The quantum computer control system of claim 1, wherein the signal generator circuit comprises an output port which is configured to output the analog signal to an external device, in particular to a quantum computer.

9. The quantum computer control system of claim 1, wherein the signal generator circuit comprises a communication interface which is configured for forwarding the recorded digital signal and/or parameters of the recorded digital signal.

10. The quantum computer control system of claim 1, wherein the signal generator circuit comprises a digital signal processor, DSP, which is coupled between the digital signal generating module and the DAC, wherein the DSP is configured to adapt the digital signal.

11. The quantum computer control system of claim 1, wherein the signal generator circuit comprises a signal generator interface which is configured to receive communication data; and wherein the digital signal generating module is configured to generate the digital signal at least partially based on the received communication data.

* * * * *